(12) United States Patent
Singh et al.

(10) Patent No.: US 11,994,800 B2
(45) Date of Patent: *May 28, 2024

(54) DOSE REDUCTION OF PATTERNED METAL OXIDE PHOTORESISTS

(71) Applicant: Applied Materials, Inc., Santa Clara, CA (US)

(72) Inventors: Tejinder Singh, San Jose, CA (US); Lifan Yan, San Jose, CA (US); Abhijit B. Mallick, Fremont, CA (US); Daniel Lee Diehl, Chiba (JP); Ho-yung Hwang, Cupertino, CA (US); Jothilingam Ramalingam, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/081,499

(22) Filed: Dec. 14, 2022

(65) Prior Publication Data

US 2023/0115004 A1 Apr. 13, 2023

Related U.S. Application Data

(62) Division of application No. 16/890,867, filed on Jun. 2, 2020, now Pat. No. 11,550,222.

(Continued)

(51) Int. Cl.
*G03F 7/09* (2006.01)
*G03F 7/20* (2006.01)
(Continued)

(52) U.S. Cl.
CPC .......... *G03F 7/094* (2013.01); *H01L 21/0274* (2013.01); *H01L 21/0332* (2013.01); *H01L 21/3081* (2013.01); *G03F 7/20* (2013.01)

(58) Field of Classification Search
CPC . G03F 7/094; G03F 7/20; G03F 7/091; G03F 7/0043; H01L 21/0274; H01L 21/0332; H01L 21/3081
(Continued)

(56) References Cited

U.S. PATENT DOCUMENTS 8,986,921 B2 3/2015 Edelstein et al.
9,929,012 B1 3/2018 Belyansky et al.
(Continued)

FOREIGN PATENT DOCUMENTS

JP 2008047251 A 2/2008
JP 2010045359 A 2/2010
(Continued)

OTHER PUBLICATIONS

1 Japanese Office Action dated Aug. 2, 2023 for Application No. 2022-505402.
(Continued)

*Primary Examiner* — Caleen O Sullivan
(74) *Attorney, Agent, or Firm* — Patterson + Sheridan, LLP

(57) ABSTRACT

Embodiments of the present disclosure generally relate to a multilayer stack used as a mask in extreme ultraviolet (EUV) lithography and methods for forming a multilayer stack. In one embodiment, the method includes forming a carbon layer over a film stack, forming a metal rich oxide layer on the carbon layer by a physical vapor deposition (PVD) process, forming a metal oxide photoresist layer on the metal rich oxide layer, and patterning the metal oxide photoresist layer. The metal oxide photoresist layer is different from the metal rich oxide layer and is formed by a process different from the PVD process. The metal rich oxide layer formed by the PVD process improves adhesion of the metal oxide photoresist layer and increases the (Continued)

secondary electrons during EUV lithography, which leads to decreased EUV dose energies.

20 Claims, 2 Drawing Sheets

Related U.S. Application Data

(60) Provisional application No. 62/881,452, filed on Aug. 1, 2019.

(51) Int. Cl.
*H01L 21/027* (2006.01)
*H01L 21/033* (2006.01)
*H01L 21/308* (2006.01)

(58) Field of Classification Search
USPC .............................................. 430/270.1, 311
See application file for complete search history.

(56) References Cited

U.S. PATENT DOCUMENTS

| 10,395,925 | B2 | 8/2019 | De Silva et al. |
| 11,550,222 | B2 * | 1/2023 | Singh .................... G03F 7/0043 |
| 2008/0017992 | A1 | 1/2008 | Kito et al. |
| 2010/0327412 | A1 | 12/2010 | Lee et al. |
| 2012/0088369 | A1 | 4/2012 | Weidman et al. |
| 2013/0129995 | A1 | 5/2013 | Ouattara et al. |
| 2014/0110373 | A1 | 4/2014 | Nishimura et al. |
| 2017/0271150 | A1 | 9/2017 | Chang et al. |
| 2018/0203355 | A1 | 7/2018 | De Silva et al. |
| 2018/0358222 | A1 | 12/2018 | Venkatasubramanian et al. |
| 2019/0206681 | A1 | 7/2019 | De Silva et al. |
| 2020/0013620 | A1 | 1/2020 | Fung et al. |

FOREIGN PATENT DOCUMENTS

| JP | 2013540359 A | 10/2013 |
| JP | 2014134581 A | 7/2014 |
| JP | 2017116923 A | 6/2017 |
| TW | 200517771 A | 6/2005 |
| TW | 201216331 A | 4/2012 |
| TW | 201735191 A | 10/2017 |
| TW | 201842573 A | 12/2018 |
| TW | 201911406 A | 3/2019 |
| WO | 2017198418 A1 | 11/2017 |
| WO | 2018152115 A1 | 8/2018 |
| WO | 2019036582 A1 | 2/2019 |

OTHER PUBLICATIONS

Internaional Search Report and Written Opinion for Application No. PCT/US2020/035751 dated Oct. 8, 2020.
Office Action for U.S. Appl. No. 16/890,867 dated Mar. 7, 2022.
Japanese Office Action dated Apr. 11, 2023 for Application No. 2022-505402.
Taiwan office action dated Nov. 6, 2023 for Application No. 109121432.
Search Report dated Oct. 20, 2023 for Taiwan Invention Patent Application No. 109121432.
Japanese Office Action dated Feb. 1, 2021 for Application No. 2022-505402.
Taiwanese Office Action Dated Apr. 16, 2024 re: Patent Application No. 109121432

\* cited by examiner

DOSE REDUCTION OF PATTERNED METAL OXIDE PHOTORESISTS

CROSS-REFERENCE TO RELATED APPLICATION

This application is a divisional application of U.S. patent application Ser. No. 16/890,867, filed Jun. 2, 2020, which claims priority to U.S. Provisional Patent Application No. 62/881,452, filed Aug. 1, 2019. All of the above applications are herein incorporated by reference in their entireties.

BACKGROUND

Field

Embodiments of the present disclosure generally relate to an apparatus and a method and, more specifically, to a multilayer stack and methods for forming a multilayer stack.

Description of the Related Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features. Reliable formation of these interconnects is needed to further increase device and interconnect density.

One process used to form various interconnect and other semiconductor features uses extreme ultraviolet (EUV) lithography. Conventional EUV patterning uses a multilayer stack in which a photoresist is patterned on top of a hardmask. Common hardmask materials are spin-on silicon anti-reflective coating (SiARC) and a deposited silicon oxynitride (SiON). The SiARC incorporates organic content to a silicon backbone, maintaining sufficient etch selectivity to the photoresist and underlying stack. Scaling the thickness of the SiARC backbone can be challenging and spin coating limits the minimum thickness that can be achieved without too many defects. The SiON hardmask uses an organic adhesion layer (OAL) for improved resist adhesion. The OAL prevents poisoning from nitrogen and is able to be reworked.

Several metal oxide materials have been tested as EUV hardmasks (HM). The metal oxide films, including films with high EUV absorption elements were stoichiometric and not conductive. Furthermore, EUV lithography process generally takes a significant amount of exposure time and requires large amounts of energy.

Therefore, there is a need in the art for new multilayer stack as a mask that allows for decreased dose time and/or lower dose energies.

SUMMARY

Embodiments of the present disclosure generally relate to a multilayer stack used as a mask in extreme ultraviolet (EUV) lithography and methods for forming a multilayer stack.

In one embodiment, a method of forming a multilayer stack is provided. The method includes forming a first layer on a film stack, the first layer comprising a carbon-containing layer, forming a second layer on the first layer by a physical vapor deposition process, the second layer comprising a metal rich oxide layer, and forming a metal oxide photoresist layer on the second layer, the metal oxide photoresist layer comprising a material different from the second layer.

In another embodiment, a multilayer stack is provided. The multilayer stack includes a first layer disposed on a film stack, the first layer comprising a carbon-containing layer, a second layer disposed on the first layer, the second layer comprising a metal rich oxide layer, and a metal oxide photoresist layer disposed on the second layer, the metal oxide photoresist layer comprising a material different from the second layer.

In yet another embodiment, a non-transitory computer readable storage medium is provided. The non-transitory computer readable storage medium includes a plurality of instructions, the plurality of instructions including instructions to control components of a processing system to perform the process of forming a first layer on a film stack, the first layer comprising a carbon-containing layer, forming a second layer on the first layer by a physical vapor deposition process, the second layer comprising a metal rich oxide layer, and forming a photoresist layer on the second layer, the photoresist layer comprising a polymer with a metal oxide coating.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a multilayer stack used as a mask in EUV lithography and methods for forming the multilayer stack. In one embodiment, the method includes forming a carbon layer over a film stack, forming a metal rich oxide layer on the carbon layer by a physical vapor deposition (PVD) process, forming a metal oxide photoresist layer on the metal rich oxide layer, and patterning the metal oxide photoresist layer. The metal oxide photoresist layer is different from the metal rich oxide layer and is formed by a process different from the PVD process. The metal rich oxide layer formed by the PVD process improves adhesion of the metal oxide photoresist layer and increases the secondary electrons during EUV lithography, which leads to decreased EUV dose energies.

Figure 1:
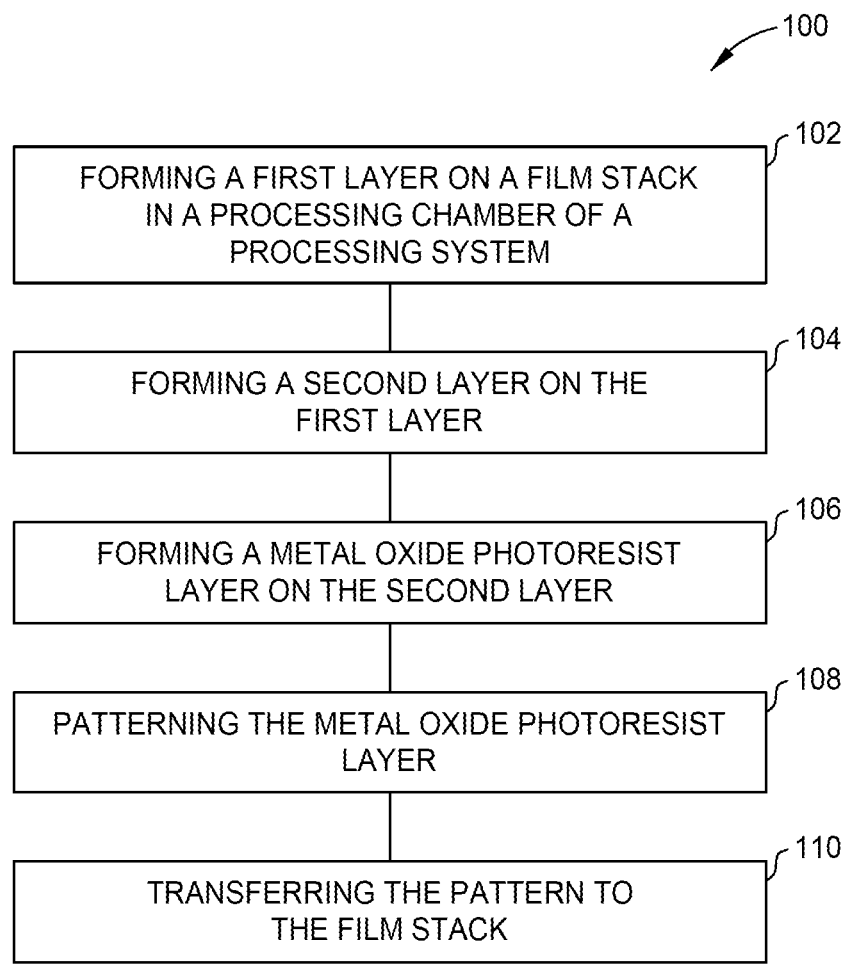
FIG. 1 is a flow diagram of a method for a patterning process, according to one embodiment.
Figure 2:
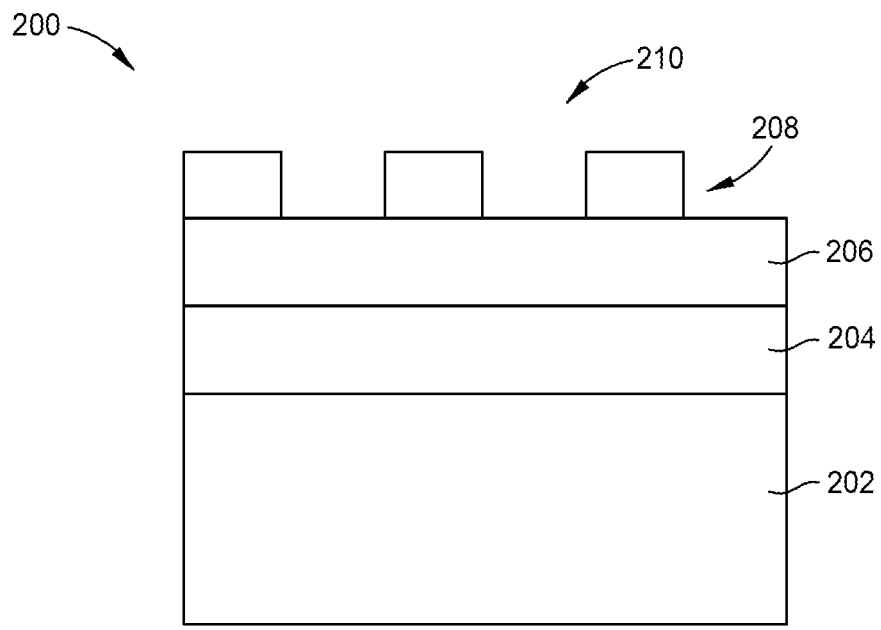
FIG. 2 illustrates a structure, according to one embodiment.

FIG. 1 is a flow diagram of a method 100 for a patterning process, according to one embodiment. FIG. 2 illustrates a structure 200, according to one embodiment. The structure 200 can be formed during the patterning process of FIG. 1. Those skilled in the art should recognize that a full process for forming a semiconductor device and the associated structures are not illustrated in the drawings or described herein. Although various operations are illustrated in the drawings and described herein, no limitation regarding the order of such operations or the presence or absence of operations is implied. Operations depicted or described as sequential are, unless explicitly specified, merely done so for purposes of explanation without precluding the possibility that the respective operations are actually performed in concurrent or overlapping manner, at least partially if not entirely.

The method 100 starts at operation 102 by forming a first layer 204 on a film stack 202 in a processing chamber of a processing system. The film stack 202 can be utilized to form a gate structure, a contact structure, or an interconnection structure in a front end or back end process. The film stack 202 can include stair-like structures used in a memory structure, such as a NOT-AND (NAND) structure.

In one embodiment, the film stack 202 has a number of vertically stacked layers. The film stack 202 can include pairs of alternating layers, such as alternating dielectric layers, for example, alternating oxide and nitride layers. The alternating dielectric layers can include silicon oxide, silicon nitride, silicon oxynitride, silicon carbide, silicon oxycarbide, titanium nitride, any other composite of oxide and nitride, or any combination of the above. In some embodiments, the dielectric layers include one or more high-k materials having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), or any combination of above.

The first layer 204 can be a carbon-containing layer, such as a high-density carbon-containing layer. In one embodiment, the first layer 204 is a hard mask made of doped carbon, such as boron doped amorphous carbon. The first layer 204 can be a Saphira™ hard mask produced by Applied Materials, Inc., located in Santa Clara, Calif. In one embodiment, the first layer 204 includes one or more of Advanced Patterning Film (APF) carbon hard masks produced by Applied Materials, Inc., located in Santa Clara, Calif.

In some embodiments, the first layer 204 is a high-density carbon-containing layer and has superior film qualities such as improved hardness and density. Such hardness and density allow the first layer 204 to act as a stronger barrier against metal infiltration and to reduce nanofailures to a greater extent than conventional SOC films.

In some embodiments, the first layer 204 has one or more of the following characteristics:

1) A quantity/percentage of $sp^3$ hybridized carbon atoms (i.e., a $sp^3$ hybridized carbon atom content) that is at least about 40, 45, 50, 55, 60, 65, 70, 75, 80, or 85 percent of the total amount of carbon atoms in the as-deposited layer, such as from is from about 50 to about 90 percent, or from about 60 to about 70 percent.

2) A thickness that is between about 5 Å and about 20,000 Å, such as from about 300 Å to about 5000 Å, or between about 2000 Å and about 3000 Å, or about 5 Å to about 200 Å.

3) A refractive index at about 633 nm that is greater than about 2.0, for example, approximately about 2.0 to approximately about 3.0, such as about 2.3.

4) An extinction coefficient at about 633 nm that is greater than about 0.1, for example, about 0.2 to about 0.3, such as about 0.25.

5) A stress that is less than about −300 MPa, for example from about −600 MPa to about −300 MPa, or about −600 MPa to about −500 MPa, such as about −550 MPa.

6) A density that is greater than about 1.8 g/cc, for example about 2.0 g/cc or higher, or about 2.5 g/cc or higher, such as from about 1.8 g/cc to about 2.5 g/cc.

7) An elastic modulus that is greater than 150 about GPa, such as about 200 GPa to about 400 GPa.

The first layer 204 can be formed on the film stack 202 by a physical vapor deposition (PVD) process or a plasma enhanced chemical vapor deposition (PECVD) process. In one embodiment, the first layer 204 is a diamond-like carbon layer. The diamond-like carbon layer described herein can be formed by chemical vapor deposition (CVD) (plasma enhanced and/or thermal) processes using hydrocarbon-containing gas mixtures. The hydrocarbon-containing gas mixture can include precursors including, but not limited to, acetylene, propene, methane, butene, 1,3-dimethyladamantane, bicyclo[2.2.1]hepta-2,5-diene (2,5-Norbornadiene), adamantine, norbornene, or combinations thereof.

The deposition process can be carried out at temperatures ranging from about −50° C. to about 600° C. The deposition process can be carried out at pressures ranging from about 0.1 mTorr to about 10 Torr in a processing volume. The hydrocarbon-containing gas mixture can further include any one of, or a combination of any of helium, argon, xenon, nitrogen gas ($N_2$), and hydrogen gas ($H_2$).

The hydrocarbon-containing gas mixture can further include etchant gases such as chlorine gas, carbon tetrafluoride, and/or nitrogen trifluoride to improve film quality. The plasma (e.g., capacitive-coupled plasma) can be formed from either top and bottom electrodes or side electrodes. The electrodes can be formed from a single powered electrode, dual powered electrodes, or more electrodes with multiple frequencies such as, but not limited to, about 350 KHz to about 100 MHz, being used alternatively or simultaneously in a CVD system with any or all of the reactant gases listed herein to deposit a thin layer of diamond-like carbon for use as a hardmask and/or etch stop or any other suitable application.

The high etch selectivity of the diamond-like carbon layer is achieved by having higher density and modulus than current generation films. Not to be bound by theory, it is believed that the higher density and modulus are a result of the high content of $sp^3$ hybridized carbon atoms in the layer, which in turn can be achieved by a combination of low pressure and plasma power.

In some embodiments, hydrogen radicals are fed through a remote plasma source (RPS), which leads to selective etching of $sp^2$ hybridized carbon atoms. Therefore, the $sp^3$ hybridized carbon atom fraction of the layer is increased further, thus further increasing the etch selectivity.

In one embodiment, the diamond-like carbon layer is deposited in a chamber with a substrate pedestal maintained at about 10° C., and the pressure is maintained at about 2 mTorr, with plasma generated at the substrate level by applying a bias of about 2500 W, at a frequency of about 13.56 MHz, to an electrostatic chuck. In some embodiments, an additional radio frequency (RF) of about 1000 W at about 2 MHz is also delivered to the electrostatic chuck, thereby generating a dual-bias plasma at the substrate level.

At operation 104, a second layer 206 is formed on the first layer 204. The second layer 206 is a metal oxide layer formed by a PVD process. The metal oxide layer can be a metal rich oxide layer that provides ample secondary electrons when excited by EUV radiation. A fully stoichiometric metal oxide layer does not yield as many electrons as the metal rich oxide layer. A metal rich oxide layer including a high Z metal and lower resistance are considered for the EUV process to reduce the EUV dose energies. The high Z metal refers to a metal having an atomic number greater than or equal to 40. In some embodiments, the second layer 206 is a metal rich oxide layer including one or more of tin (Sn), indium (In), gallium (Ga), zinc (Zn), tellurium (Te), antimony (Sb), nickel (Ni), titanium (Ti), aluminum (Al), or tantalum (Ta). Examples of the metal rich oxide layer include tin oxide ($SnO_x$), indium gallium zinc oxide (IGZO), indium tin oxide (ITO), tantalum oxide ($TaO_x$), or other suitable metal rich oxide. The metal rich oxide layer is formed by the PVD process that can produce a metal oxide layer having nonstoichiometric ratio of metal to oxide, such as higher metal content. For example, a stoichiometric metal oxide layer can be characterized as $M_xO_y$, where M is one or more metals, and the stoichiometric metal to oxide ratio is x to y. A metal rich oxide layer produced by the PVD process can have a metal to oxide ratio of about 1.5 x-to-y or greater, such as about 2 x-to-y or greater.

At operation 106, a metal oxide photoresist layer 208 is formed on the second layer 206. The metal oxide photoresist layer 208 can include molecular metal oxide cluster cores, and each core has multiple radiation-sensitive ligands. The metal oxide photoresist layer 208 is fabricated from a material different from the second layer 206. The second layer 206 improves the adhesion of the metal oxide photoresist layer 208 to the second layer 206.

At operation 108, the metal oxide photoresist layer 208 is patterned to form a pattern 210 in the metal oxide photoresist layer 208. The metal oxide photoresist layer 208 can be a positive resist that becomes soluble upon exposure to radiation, or a negative resist that becomes insoluble upon exposure to radiation. The radiation can have a wavelength in the EUV range.

At operation 110, the pattern 210 is transferred to the film stack 202 by one or more etching processes. The pattern 210 is first transferred to the first and second layers 204, 206, and then to the film stack 202. The one or more etching processes can include any suitable etching processes.

The first layer 204 can be a doped carbon layer or a high-density carbon containing layer, and the second layer 206 can be a metal rich oxide layer formed by a PVD process. In one embodiment, the first layer 204 is a doped carbon layer, such as a boron doped carbon layer, and the second layer 206 is a metal rich oxide layer. In another embodiment, the first layer 204 is a high-density carbon-containing layer, such as a diamond-like carbon layer having a density greater than about 1.8 g/cc.

Figure 3:
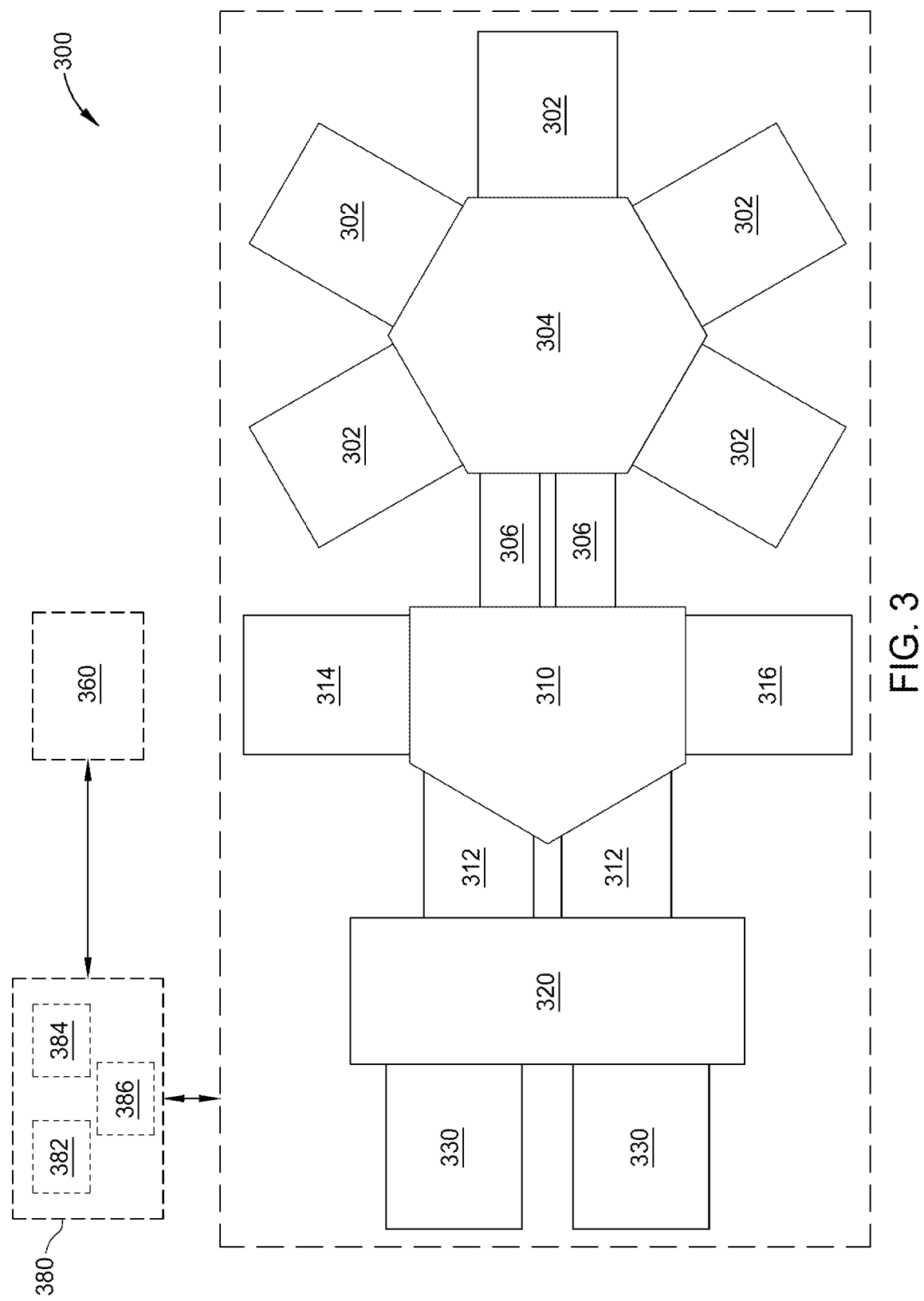
FIG. 3 illustrates a schematic top-view diagram of a multi-chamber processing system, according to one embodiment.

FIG. 3 illustrates a schematic top-view diagram of a multi-chamber processing system 300, according to one embodiment. The multi-chamber processing system 300 can be configured to perform the method 100. Examples of a processing system that can be suitably modified in accordance with the teachings provided herein include the ENDURA®, PRODUCER® or CENTURA® integrated processing systems or other suitable processing systems commercially available from Applied Materials, Inc., located in Santa Clara, California. It is contemplated that other processing systems (including those from other manufacturers) can be adapted to benefit from aspects described herein.

As shown in FIG. 3, a plurality of process chambers 302 is coupled to a first transfer chamber 304. The first transfer chamber 304 is also coupled to a first pair of pass-through chambers 306. The first transfer chamber 304 has a centrally disposed transfer robot (not shown) for transferring substrates between the pass-through chambers 306 and the process chambers 302. The pass-through chambers 306 are coupled to a second transfer chamber 310, which is coupled to a process chamber 314 and a process chamber 316. The second transfer chamber 310 has a centrally disposed transfer robot (not shown) for transferring substrates between a set of load lock chamber 312 and the process chamber 314 or the process chamber 316. A factory interface 320 is connected to the second transfer chamber 310 by the load lock chambers 312. The factory interface 320 is coupled to one or more pods 330 on the opposite side of the load lock chambers 312. The pods 330 typically are front opening unified pods (FOUP) that are accessible from a clean room.

During operation, a substrate is first transferred to the process chamber 314 or process chamber 316, where a carbon-containing layer, such as the first layer 204, is formed on a film stack, such as the film stack 202 of FIG. 2. In other words, operation 102 of the method 100 can be performed in the process chamber 314 or 316.

The substrate is then transferred to the one or more process chambers 302 in which a metal rich oxide layer, such as the second layer 206, is formed on the carbon-containing layer by a PVD process. In other words, operation 104 of the method 100 can be performed in the process chamber 302. The process chamber 302 can be a PVD chamber. Because the operations 102 and 104 are performed within the same processing system 300, vacuum is not broken as the substrate is transferred to various chambers, which decreases the chance of contamination and improves the quality of the deposited epitaxial film.

In some embodiments, the substrate is provided to a chamber of a processing system different from the processing system 300, to form a photoresist layer (operation 106). The patterning of the photoresist layer (operation 108) and the transferring of the pattern to the film stack (operation 110) can be performed in chambers of a processing system different from the processing system 300. In other words, operations 102 and 104 can be performed in a first processing system, and operations 106, 108, and 110 can be performed in second processing system different from the first processing system.

A system controller 380 is coupled to the processing system 300 for controlling the processing system 300 or components thereof. For example, the system controller 380 controls the operations of the processing system 300 using a direct control of the chambers 302, 304, 306, 310, 312, 314, 316, factory interface 320, and/or pods 330 of the processing system 300. In another example, the system controller 380 controls individual controllers associated with the chambers 302, 304, 306, 310, 312, 314, 316, factory interface 320, and/or pods 330 of the processing system 300. In operation, the system controller 380 enables data collection and feedback from the respective chambers to coordinate performance of the processing system 300.

The system controller 380 generally includes a central processing unit (CPU) 382, memory 384, and support circuits 386. The CPU 382 can be one of any form of a general purpose processor that can be used in an industrial setting. The memory 384, non-transitory computer-readable medium, or machine-readable storage device, is accessible by the CPU 382 and can include random access memory (RAM), read only memory (ROM), floppy disk, hard disk, or any other form of digital storage, local or remote. The support circuits 386 are coupled to the CPU 382 and comprise cache, clock circuits, input/output subsystems, power supplies, and the like.

The system controller 380 is configured to perform one or more operations of the method 100 stored in the memory 384. The various embodiments disclosed in this disclosure are generally implemented under the control of the CPU 382 by executing computer instruction code stored in the memory 384 (or in memory of a particular process chamber) as, for example, a computer program product or software routine. That is, the computer program product is tangibly embodied on the memory 384 (or non-transitory computer-readable medium or machine-readable storage device). When the computer instruction code is executed by the CPU 382, the CPU 382 controls the chambers to perform operations in accordance with the various embodiments.

As described above, embodiments of the present disclosure reduces EUV dose energies by utilizing a metal rich oxide layer and a metal oxide photoresist formed on the metal rich oxide layer. The adhesion of the metal oxide photoresist to the metal rich oxide layer is also improved. Furthermore, embodiments of the present disclosure utilizes a high-density carbon containing layer that acts as a strong barrier against metal infiltration and reduce nanofailures in EUV processes.

While the foregoing is directed to embodiments of the present disclosure, other and further embodiments of the disclosure may be devised without departing from the basic scope thereof, and the scope thereof is determined by the claims that follow.

What is claimed is:

1. A multilayer stack used as a mask in extreme ultraviolet lithography, comprising:
   a first layer disposed on a film stack, the first layer comprising a carbon-containing layer;
   a second layer disposed on the first layer, the second layer comprising a stoichiometric ratio of metal to oxide ratio of 1.5 or more parts metal to 1 part oxide; and
   a metal oxide photoresist layer disposed on the second layer, the metal oxide photoresist layer comprising a material different from the second layer.

2. The multilayer stack of claim 1, wherein the first layer further comprises a percentage of $sp^3$ hybridized carbon atoms between about 50% to about 90%.

3. The multilayer stack of claim 1, wherein the first layer further comprises a boron doped carbon layer.

4. The multilayer stack of claim 1, wherein the first layer further comprises a thickness of about 300 angstroms to about 5000 angstroms.

5. The multilayer stack of claim 4, wherein the second layer is a tin oxide layer, an indium gallium zinc oxide layer, an indium tin oxide layer, or a tantalum oxide layer.

6. The multilayer stack of claim 1, wherein the first layer is a diamond-like carbon layer.

7. The multilayer stack of claim 1, wherein the second layer further comprises a high Z metal.

8. The multilayer stack of claim 1, wherein the second layer further comprises one or more materials selected from the group consisting of tin, indium, gallium, zinc, tellurium, antimony, nickel, titanium, aluminum, and tantalum.

9. The multilayer stack of claim 8, wherein the second layer is a tin oxide layer, an indium gallium zinc oxide layer, an indium tin oxide layer, or a tantalum oxide layer.

10. An extreme ultraviolet lithography mask, comprising:
    a first layer of a film stack comprising a carbon-containing layer;
    a second layer disposed on the first layer, comprising a metal rich oxide layer; and
    a metal oxide photoresist layer disposed on the second layer, a material different from the second layer.

11. The extreme ultraviolet lithography mask of claim 10, wherein the first layer further comprises a doped carbon-containing layer.

12. The extreme ultraviolet lithography mask of claim 10, wherein the first layer further comprises an elastic modulus greater than 150 GPa.

13. The extreme ultraviolet lithography mask of claim 10, wherein the first layer further comprises a carbon-containing layer having a density greater than about 1.8 g/cc.

14. The extreme ultraviolet lithography mask of claim 13, wherein the carbon-containing layer is a diamond-like carbon layer.

15. The extreme ultraviolet lithography mask of claim 10, wherein the second layer further comprises a high Z metal.

16. The extreme ultraviolet lithography mask of claim 10, wherein the second layer further comprises one or more materials selected from the group consisting of tin, indium, gallium, zinc, tellurium, antimony, nickel, titanium, aluminum, and tantalum.

17. The extreme ultraviolet lithography mask of claim 16, wherein the second layer is a tin oxide layer, an indium gallium zinc oxide layer, an indium tin oxide layer, or a tantalum oxide layer.

18. The extreme ultraviolet lithography mask of claim 10, wherein the metal oxide photoresist layer comprises a plurality of molecular metal oxide cluster cores, wherein each molecular metal oxide cluster core of the plurality of molecular metal oxide cluster cores has multiple radiation-sensitive ligands.

19. The extreme ultraviolet lithography mask of claim 10, wherein the metal oxide photoresist layer is a positive resist that is soluble if exposed to radiation.

20. The extreme ultraviolet lithography mask of claim 10, wherein the metal oxide photoresist layer is a negative resist that is insoluble if exposed to radiation.

* * * * *